United States Patent [19]
Linn et al.

[11] Patent Number: 5,603,779
[45] Date of Patent: Feb. 18, 1997

[54] BONDED WAFER AND METHOD OF FABRICATION THEREOF

[75] Inventors: Jack H. Linn; George Bajor, both of Melbourne; George V. Rouse, Indialantic, all of Fla.

[73] Assignee: Harris Corporation, Melbourne, Fla.

[21] Appl. No.: 443,242

[22] Filed: May 17, 1995

[51] Int. Cl.$^6$ .................................................. H01L 21/20
[52] U.S. Cl. .............................. 148/33; 437/61; 437/62; 437/974; 148/DIG. 12
[58] Field of Search ............................. 437/61, 62, 974; 148/DIG. 12, DIG. 135, 33

[56] References Cited

U.S. PATENT DOCUMENTS

| | | | |
|---|---|---|---|
| 4,939,101 | 7/1990 | Black et al. ........................... | 437/62 |
| 5,383,993 | 1/1995 | Katada et al. ....................... | 148/DIG. 12 |
| 5,407,506 | 4/1995 | Goetz et al. ........................ | 148/DIG. 12 |
| 5,407,856 | 4/1995 | Quenzer et al. ..................... | 437/61 |
| 5,451,547 | 9/1995 | Himi et al. .......................... | 148/DIG. 12 |

*Primary Examiner*—Trung Dang
*Attorney, Agent, or Firm*—Harry L. Deffebach, III

[57] ABSTRACT

A bonded wafer with a bond junction having low resistivity due to the low level of oxides at the bond junction. A plasma that removes native oxide layers from wafers is exposed to the wafers. The plasma forms a hydrophobic polymer seal on the wafers, inhibiting subsequent native oxide growth upon exposure to air. The polymer seal on the wafers to be bonded are pressed together and the wafers are annealed to form the bonded wafer in a non-oxidizing ambient. The bond junction formed is primarily silicon to silicon and silicon to carbon bonds.

28 Claims, 1 Drawing Sheet

5,603,779

BONDED WAFER AND METHOD OF FABRICATION THEREOF

FIELD OF THE INVENTION

The present invention is an improved method for bonding semiconductor wafers, and more particularly, is an improved method for directly bonding semiconductor wafers together whereby native oxides between the bonded wafers are greatly limited.

BACKGROUND OF THE INVENTION

It is known in the art to directly bond two semiconductor wafers, such as two silicon semiconductor wafers. For example, a P type wafer and an N type wafer can be bonded together to form a P-N junction. Direct bonding of wafers is disclosed in U.S. Pat. No. 4,939,101 dated Jul. 3, 1990, and assigned to the assignee of the present application, the disclosure thereof being hereby incorporated by reference.

Wafer bonding is commonly achieved by sintering together the "bare" surfaces of two individual semiconductor substrates, such as two silicon wafers. Such bonding is commonly referred to as silicon-to-silicon bonding and the resulting composite wafer is referred to as an STS wafer. A deep P-N junction can be provided in the STS wafer by selecting as source wafers two wafers having the same crystallographic orientation and opposite conductivity types of desired dopant concentrations as is familiar to those skilled in the art.

Despite the fact that STS bonding is commonly referred to as involving bonding of "bare" silicon, native oxides exist between the wafers. Specifically, oxides grow on the wafer when the wafer is exposed to air.

For conventional bonding of wafers, plasmas are used to remove the impure oxides on the surfaces to be bonded. After such oxide removal, the plasma leaves a thin polymer layer on the wafers. This polymer layer is conventionally thought of as undesirable, so many techniques are used to remove the polymer. Such techniques used to remove polymers include using a mixture of sulfuric acid and peroxide or ashing. After the polymer layer is removed, pure oxide layers are intentionally formed on the wafers. The oxide is formed because silicon will not bond well to silicon. The oxygen thus acts as the bonding medium between the wafers.

However, for STS and other devices this oxidation layer formed between bonded wafers is detrimental to operation. For example, the oxide layer formed at the P-N junction is highly resistive. For power devices this high resistance results in increased power loss across the junction and lower device efficiency.

Therefore, it would be desirable to form bonded wafers without an oxidation layer being formed at the junction of the wafers. It would be desirable if such a device could be formed without the need to shield the wafers from air to avoid formation of native oxides. Such a device would have lower resistance at the bond junction.

SUMMARY OF THE INVENTION

The present invention solves the above described problems in the art by providing a method for bonding two wafers whereby the bond junction is largely free of oxygen.

The present invention provides a method for bonding wafers that includes the steps of exposing at least a portion of both wafers to a plasma that removes native oxides, forms a hydrophobic polymer seal on the portion of each of the wafers that was exposed to the plasma, positioning the wafers so that the polymer seal on the first wafer is adjacent the polymer seal on the second wafer, and annealing the wafers in an inert ambient atmosphere. The plasma thus functions to remove the native oxides and form a hydrophobic, polymer seal on the wafer surfaces. Because this polymer seal functions as a barrier to oxygen and water vapor, it precludes the growth of oxides when the wafers are exposed to air. The wafers are then bonded without the oxide layers using the polymer seal as the bonding medium.

More specifically, the first and second wafers are exposed to a de-oxidizing agent, such as a carbon-fluorine-hydrogen plasma. As is discussed in U.S. Pat. No. 5,395,774, assigned to the assignee of the present invention, the disclosure thereof being hereby incorporated by reference, such a plasma removes oxides on a semiconductor surface.

A polymer seal is formed on the semiconductor surface as a result of exposure to the plasma. These polymer seals are extremely hydrophobic and are excellent barriers to oxygen so that oxidation of the silicon under the seals will be greatly reduced when the wafers are removed from the plasma environment and exposed to air.

The portion of the wafers with the polymer seals are pressed together and placed in a wafer boat to be bonded. The wafers are heated in a non-oxidizing inert atmosphere for a desirable period of time. Destructive distillation of the bond occurs so that the hydrogen and fluorine are driven away leaving carbon.

The bonded wafer formed by the above process includes a first wafer bonded to a second wafer, wherein the bond junction is primarily formed of silicon to silicon bonding, with some silicon to carbon bonding also occurring. The relative absence of oxides in the bonding junction results in a bond of low resistivity. The presence of the silicon to carbon bonding increases the bandgap of the resulting junction, a desirable result in certain applications.

It is an object of the present invention to provide an improved wafer bonding process.

It is another object of the present invention to provide a wafer bonding process that greatly reduces the oxides native to bond junctions.

It is another object of the present invention to provide a process for bonding a P type wafer to an N type wafer wherein the bond junction between the two wafers is relatively free of oxides.

It is another object of the present invention to provide a bonded wafer with a low resistivity bond junction.

Other objects, advantages, and features of the present invention will become apparent from the following detailed description of the invention when considered in conjunction with the accompanying drawings.

DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
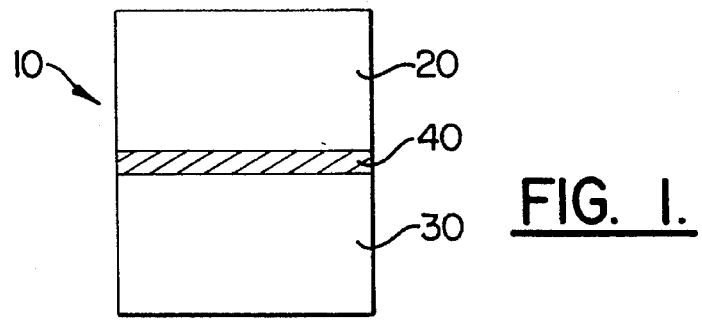
FIG. 1 shows a perspective view of the preferred bonded wafer of the present invention.

Referring now to FIG. 1, the preferred embodiment of the bonded wafer 10 is illustrated. The bonded wafer 10 is formed of a first wafer 20 and a second wafer 30 that are joined at bond junction 40. In the preferred embodiment of the present invention, the first wafer 20 is a P type semiconductor material and the second wafer 30 is a N type semiconductor material, so that the bonded wafer 10 forms a P-N junction. Those skilled in the art are familiar with bonding a P type wafer and N type wafer together to form a P-N junction. However, as is described in detail below, the preferred embodiment of the present bonded wafer 10 has a bond junction 40 that is relatively oxide free so the P-N junction has low series resistivity.

Figure 2:
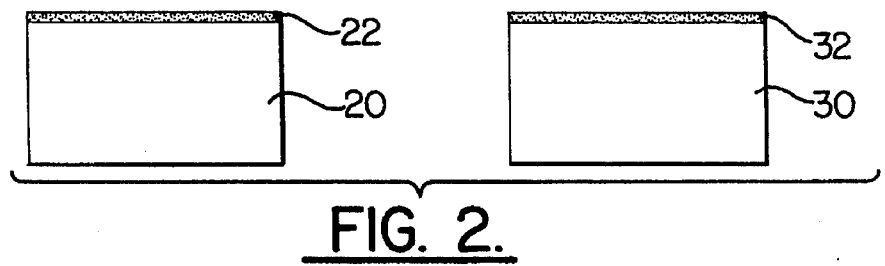
FIG. 2 shows two wafers to be bonded with native oxide layers formed thereon.

Referring now to FIG. 2, before bonding both the first and second wafers 20 and 30 have native oxide layers 22 and 32 respectively. As is familiar to those skilled in the art, the native oxide layers 22 and 32 form as a result of exposure of the semiconductor wafers 20 and 30 to air. Alternatively, a thin chemical oxide may be formed on the silicon by exposure of a $H_2SO_4/H_2O_2$ solution to the substrate.

Figure 3:
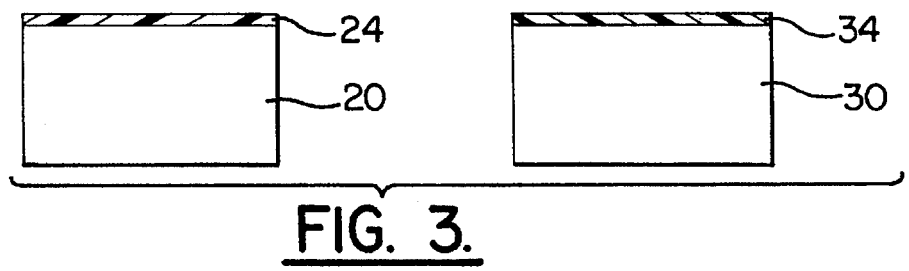
FIG. 3 shows the two wafers of FIG. 2 with polymer seals formed thereon.

FIG. 3 shows the two wafers, 20 and 30, of FIG. 2 with polymer seals, 24 and 34, respectively, replacing the oxide layers, 22 and 32 respectively. The polymer seals 24 and 34 replace the native oxide layers 22 and 32 by the process set forth below.

The exposure of the oxide layers 22 and 32 to a suitable carbon-fluorine-hydrogen plasma removes the oxide layers 22 and 32 and leaves the polymer seals 24 and 34. The preferred plasma is $CHF_3$ but the gas mixture of the plasma etch environment may be varied to, for example, be a mixture of $CF_4$ and $H_2$, and other combinations of carbon, fluorine and hydrogen. The preferred plasma reacts with and removes the oxide layers 20 and 30. When the preferred $CHF_3$ plasma is utilized, the polymer seals 24 and 34 left on each of the exposed silicon wafers 20 and 30 are formed of fluorocarbon which is hydrophobic and a barrier to oxygen. Therefore, oxides will not form on the polymer seals 24 and 34 in the presence of air. Those skilled in the art will recognize that other suitable plasma etch techniques or de-oxidizing techniques may be used provided that the oxide layers 22 and 32 are removed and polymer seals 24 and 34 or other suitable layers are formed. The thickness of the polymer seals 24 and 34 may be controlled by the inclusion of small amounts of oxygen in the plasma gas.

In the preferred embodiment, the plasma forms the polymer seals 24 and 34 as well as removes the oxide layers 22 and 32. Those skilled in the art might use one plasma to remove the oxide layer and another plasma to form the hydrophobic, polymer seals.

Figure 4:
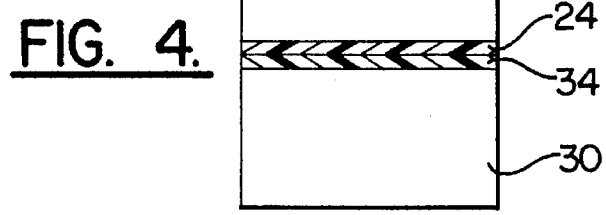
FIG. 4 shows the two bonded wafers of FIG. 3 pressed together prior to annealing.

FIG. 4 shows the two wafers 20 and 30 of FIG. 3 pressed together prior to annealing. The polymer seals 24 and 34 on the surfaces of the two wafers 20 and 30, respectively, are pressed together. Preferably the wafers 20 and 30 are bonded in this position in a non-oxidizing ambient atmosphere of nitrogen at a temperature of 1275 degrees Celsius for six hours. Those skilled in the art will recognize that annealing may be performed at many different combinations of time, pressure and temperature, including the preferred temperatures ranging from approximately 900–1300 degrees Celsius. At temperatures above about 400 degrees Celsius, destructive distillation of the polymer seals 24 and 34 occurs. Thus, the elevated temperature drives off the fluorine and hydrogen, but not the carbon. Given the absence of oxygen, the bond junction 40 is formed effectively free of a dielectric oxide layer between the wafers, 20 and 30. Those skilled in the art will recognize that the non-oxidizing ambient atmosphere may be gases other than $N_2$, such as forming gas, argon, $H_2$ or the like.

Referring back to FIG. 1, the preferred bonded wafer 10 is shown with the bond junction 40. The bond junction 40 is believed to be primarily formed of silicon-carbon and silicon-silicon bonds. The oxygen content in the bond junction 40 is preferably less than three percent. Typically, less than one-tenth of a percent of fluorine is in the bond junction 40. Those skilled in the art will recognize that the exact composition of the junction will vary with differing process characteristics and substances used in the process.

The absence of the dielectric oxide layer in the bond junction 40 makes for a low resistivity P-N junction in the preferred embodiment of the bonded wafer 10. Furthermore, the bandgap of the resulting P-N junction is believed to be increased.

After the bonded wafer 10 is formed, thinning of the wafers, bonding the electrical contacts (not shown) and other steps known to those skilled in the art and necessary to the construction of a device may be performed.

Those skilled in the art will recognize that the wafers 20 and 30 may be many different types of semiconductor materials. In the preferred embodiment of the present invention the wafers 20 and 30 are silicon, but the wafers could be germanium, gallium-arsenide or other semiconductor material. The important parameter is that the plasma seal bond well with the wafer material. Thus, one skilled in the art could use seals including diamond, graphite or other material to form the bond junction, as long as the material bonds well with silicon, germanium, gallium-arsenide or other material selected as the wafer.

The application of the plasma to prevent oxidation in the present invention has been disclosed for use with semiconductor material to form a P-N junction. However, those skilled in the art will recognize that the application of the plasma to facilitate removal of oxides for bonding wafers could be utilized to form other silicon to silicon bonded wafer devices. Furthermore, for a patterned wafer, the polymer seal or layer may be restricted by a masking material so that the plasma is deposited only on portions of the silicon.

In the drawings and specification, there have been disclosed typical preferred embodiments of the invention, and although specific terms are employed, they are used in a generic and descriptive sense only and not for purposes of limitation. Those skilled in the art will recognize variations and modifications upon the embodiments of the invention set forth above, such variations and modifications being within the scope of the invention as set forth in the following claims.

That which is claimed:

1. A method for bonding a first wafer and a second wafer, comprising the steps of:

exposing at least a portion of the first and second wafers to plasma that removes oxides;

forming polymer seals on the portion of each of the first and second wafers that was exposed to said plasma;

juxtaposing the first and second wafers so that said seal on the first wafer abuts said seal on the second wafer; and annealing the first and second wafers in a nonoxidizing ambient atmosphere.

2. The method of claim 1 wherein said plasma is generated from a composite of hydrogen, fluorine and carbon.

3. The method of claim 2 wherein said plasma is $CHF_3$.

4. The method of claim 2 wherein said plasma is a composite of $CF_4$ and $H_2$.

5. The method of claim 1 wherein the first wafer is P type and the second wafer is N type.

6. The method of claim 1 wherein the first wafer is N type and the second wafer is P type.

7. The method of claim 1 wherein the wafers are annealed for two to twenty-four hours.

8. The method of claim 1 wherein said non-oxidizing ambient atmosphere is $N_2$.

9. The method of claim 1 wherein said non-oxidizing ambient atmosphere is argon.

10. The method of claim 1 wherein said non-oxidizing ambient atmosphere is forming gas.

11. The method of claim 1 wherein said non-oxidizing ambient atmosphere is hydrogen.

12. The method of claim 1 wherein the first and second wafers are annealed at a temperature of between 900–1300 degrees Celsius.

13. The method of claim 1 wherein the first and second wafers are annealed at a temperature of greater than 400 degrees Celsius.

14. The method of claim 1 wherein the annealing step occurs at 1275 degrees Celsius for six hours.

15. The method of claim 1 wherein the first and second wafers are formed of silicon.

16. The method of claim 1 wherein the first and second wafers are formed of germanium.

17. The method of claim 1 wherein the first and second wafers are formed of a silicon-germanium compound.

18. The method of claim 1 wherein the first and second wafers are formed of a gallium-arsenide compound.

19. The method of claim 1 wherein said annealing step results in a bond junction being formed between said first and second wafers, said bond junction containing less than three-percent oxygen.

20. The method of claim 19 wherein said bond junction contains trace amounts of fluorine.

21. A method for bonding a first wafer to a second wafer, comprising the steps of:

exposing at least a portion of the first and the second wafers to a de-oxidizing agent wherein said de-oxidizing agent forms a seal on said exposed portion of the first and the second wafers;

juxtaposing the first and second wafers so that said seal on the first wafer abuts said seal on the second wafer; and annealing the first and second wafer in a non-oxidizing ambient environment.

22. The method of claim 21 wherein said non-oxidizing ambient environment is $N_2$.

23. The method of claim 21 wherein said annealing produces a bond junction with less than three percent oxygen and trace amounts of fluorine and hydrogen.

24. The method of claim 21 wherein said annealing is performed at atmospheric pressure, at a temperature in the range of 900–1300 degrees Celsium and for greater than two hours.

25. The method of claim 21 wherein said de-oxidizing agent is a plasma generated from a composite of hydrogen, fluorine, and carbon.

26. The method of claim 21 wherein said seal formed on the first and the second wafers is a polymer.

27. A method for bonding a first wafer and a second wafer, comprising the steps of:

exposing at least a portion of the first and second wafers to a plasma of carbon, hydrogen, and fluorine that removes oxides;

forming fluorocarbon polymer seals on the portion of each of the first and second wafers that were exposed to said plasma;

juxtaposing the first and second wafers so that the seal on the first wafer abuts the seal on the second wafer; and annealing the first and second wafers in a nonoxidizing ambient atmosphere at a temperature sufficient to cause destructive distillation of said polymer seals, whereby a bond junction is formed between said first and second wafers.

28. The method of claim 27 wherein said bond junction contains less than three percent oxygen.

* * * * *